United States Patent
Khalifa et al.

(10) Patent No.: US 9,419,238 B2
(45) Date of Patent: Aug. 16, 2016

(54) PIN-TYPE ORGANIC LIGHT EMITTING DIODE

(71) Applicant: ASTRON FIAMM SAFETY, La Farlède (FR)

(72) Inventors: Mohamed Khalifa, La Valette du Var (FR); Hakim Choukri, Toulon (FR); Hélène Cloarec, Hyeres (FR); Bruno Dussert-Vidalet, La Garde (FR); Phiippe Taillepierre, Toulon (FR)

(73) Assignee: Astron Fiamm Safety (FR)

( * ) Notice: Subject to any disclaimer, the term of this patent is extended or adjusted under 35 U.S.C. 154(b) by 0 days.

(21) Appl. No.: 14/409,256

(22) PCT Filed: Jun. 14, 2013

(86) PCT No.: PCT/EP2013/062362
§ 371 (c)(1),
(2) Date: Dec. 18, 2014

(87) PCT Pub. No.: WO2013/189850
PCT Pub. Date: Dec. 27, 2013

(65) Prior Publication Data
US 2015/0171361 A1  Jun. 18, 2015

(30) Foreign Application Priority Data

Jun. 18, 2012 (FR) .................................. 12 55680

(51) Int. Cl.
*H01L 51/52* (2006.01)
*H01L 51/50* (2006.01)
(52) U.S. Cl.
CPC ........ *H01L 51/5064* (2013.01); *H01L 51/5004* (2013.01); *H01L 51/506* (2013.01);
(Continued)

(58) Field of Classification Search
CPC ............ H01L 51/5064; H01L 51/5004; H01L 51/508; H01L 51/4293
See application file for complete search history.

(56) References Cited

U.S. PATENT DOCUMENTS

| 2004/0062949 A1 | 4/2004 | Pfeiffer et al. |
| 2005/0236973 A1 | 10/2005 | Leo et al. |

(Continued)

FOREIGN PATENT DOCUMENTS

| WO | WO 0017911 | 3/2000 |
| WO | WO 2007071450 | 6/2007 |

OTHER PUBLICATIONS

PCT/ISA/237 Written Opinion issued on PCT/EP2013/062362, pp. 7.

(Continued)

*Primary Examiner* — Michele Fan
(74) *Attorney, Agent, or Firm* — The Farrell Law Firm, P.C.

(57) ABSTRACT

Provided is a PIN type organic light emitting diode that includes
  a first electrode of a first electrode type,
  a first transport layer of a first type of charge carrier,
  an emission layer,
  a second transport layer of a second type of charge carrier, and
  a second electrode of a second type of electrode.
At least one of the transport layers includes at least two elementary transport layers and each elementary transport layer of the same transport layer has, in relation to an adjacent elementary transport layer, a decreasing mobility of charge carriers a farther distance from the emission layer, and consequently providing a decreasing conductivity based on a distance of the elementary transport layer from the adjacent electrode, with the elementary transport layers of the same transport layer having the same dopant concentration.

17 Claims, 4 Drawing Sheets

Figure 1:
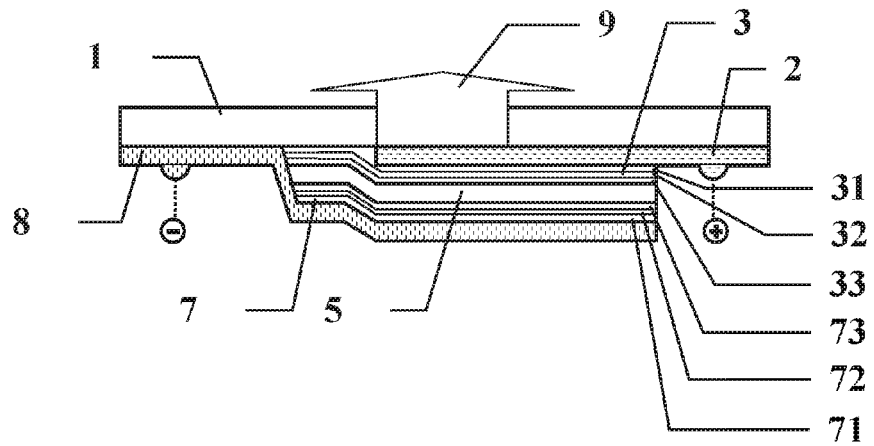

(52) U.S. Cl.
CPC .......... *H01L51/508* (2013.01); *H01L 51/5076* (2013.01); *H01L 2251/552* (2013.01); *H01L 2251/558* (2013.01)

(56) References Cited

U.S. PATENT DOCUMENTS

| | | |
|---|---|---|
| 2006/0251922 A1 | 11/2006 | Liao et al. |
| 2008/0203406 A1* | 8/2008 | He .................. H01L 51/0062 257/94 |
| 2010/0059738 A1 | 3/2010 | Burroughes et al. |
| 2012/0132900 A1 | 5/2012 | Fujita |
| 2012/0168725 A1* | 7/2012 | Lin ..................... H01L 51/5088 257/40 |
| 2013/0228753 A1* | 9/2013 | Moon ................. H01L 51/5004 257/40 |

OTHER PUBLICATIONS

PCT/ISA/210 Search Report issued on PCT/EP2013/062362, pp. 3.
Liao, Yuan-Li et al., Hole Mobilities of 2,7- and 2,2'-Disubstituted . . . , Chem. Mater. 2007, 19, 6350-6357, Copyright 2007 American Chemical Society, pp. 8.
Noh, Seunguk et al., Carrier conduction mechanism for phosphorescent . . . , Journal of Applied Physics 105, 033709 (2009), Copyright 2009 American Institute of Physics, pp. 5.

* cited by examiner

PIN-TYPE ORGANIC LIGHT EMITTING DIODE

PRIORITY

This application is a U.S. National Phase application of International Application No. PCT/EP2013/062362 filed Jun. 14, 2013, claiming priority to Application No. 12/55680 filed with the French Intellectual Property Office on Jun. 18, 2012, the content of each of which is incorporated herein by reference.

The technical field of the invention is that of organic light emitting diodes, also referred to as OLEDs.

In such an organic light emitting diode, an injection of charge carriers from the electrodes, electrons from a cathode or positive holes from an anode is produced under the effect of the application of an electrical voltage between these electrodes. The charge carriers of different natures, that is to say an electron and a hole, pair up in an active layer or emission layer comprising organic emitters, in order to form excitons. A radiative recombination emits light.

For organic light emitting diodes functioning as previously indicated an improvement in the energy efficiency is sought, both for reducing the electrical power consumed and for improving the light power produced.

In order to improve the energy efficiency of an OLED, it is necessary firstly to improve the injection of the charge carriers. This comes up against an energy barrier at the interface with the electrodes.

It is necessary secondly to improve the transport of these charge carriers to the emission layer. This comes up against the low electrical conductivity of organic materials.

U.S. Pat. No. 7,074,500 teaches that a use of a correctly doped transport layer disposed between an electrode and an emission layer solves both the injection problem and the transport problem. Such an OLED is referred to as PIN. The letter P designates the transport layer for the holes doped with an electron accepter. The letter N designates the transport layer for the electrons doped with an electron donor. The letter I designates the emission layer.

However, such a doping gives rise to an increase in the electrical conductivities of the doped transport layers. In such a structure, the resistivity of the OLED greatly decreases when the OLED becomes conductive. The resistivity of the transparent electrode used in OLEDs is always greater than that of the PIN OLED in on mode, which introduces an imbalance of injection over a large surface area of the OLED greater than 1 cm$^2$.

This is because the increase in the transparent electrode surface area causes a voltage drop in the OLED on moving away from the electrical contact of this electrode. This voltage drop on the OLED surface causes poor uniformity of luminance over the entire surface of the OLED. This uniformity is all the lower, the larger the surface area of the OLED. This poor dispersion of the voltage over a large surface of the OLED causes a poor thermal dispersion over the entire surface, which reduces the service life of the OLED.

In order to solve the problem of uniformity, producing a tandem structure that superimposes at least two OLEDs is known. This makes it possible to reduce the current and to increase the light efficiency. However, such a tandem structure leads to excessively high costs because of the material and manufacturing costs, at least doubled.

The document WO-A1 2007071450 shows an electronic device with a plurality of stacked OLEDs.

In order to solve the problem of uniformity, producing a non-doped or type III transport layer is also known. Because the low conductivity, this requires a very high operating voltage. The result is low light efficiency.

The document DE 102008 051 132 A1 describes a PIN OLED with at least one transport layer having several consecutive elementary transport layers with a decrease in conductivity in the elementary layers the further away from the electrode associated with the transport layer. This is obtained by reducing the concentration of dopant and/or modifying the dopant in the elementary transport layers.

The use of such a method is however limited because a rapid saturation of the electrical conductivity is achieved beyond a certain, relatively low, doping threshold. Thus, for an optimum adjustment of the conductivity by varying the concentration of dopant in the elementary layers of the same transport layer, it will be necessary to be able to precisely adjust the concentration of dopant in the elementary layers while remaining below a maximum concentration corresponding to dopant saturation.

However, this maximum concentration is relatively low and frequently lies between 10% and 25% according to the dopant. Therefore the dopant concentration variation range is relatively narrow and corresponds to low concentrations that are difficult to control in an OLED production system.

The problem with the present invention is obtaining, for an OLED of the PIN type, a decrease in the electrical conductivity of at least one transport layer in the direction of the emissive layer while avoiding the previously mentioned drawbacks.

The subject matter of the invention is an organic light emitting diode, OLED, of the PIN type, comprising a stack comprising the following ordered succession:
 a first electrode, of a first electrode type, from among anode or cathode, able to inject a first type of charge carrier, from among electrode or hole,
 a first transport layer of a first type of charge carrier, doped by a first type of dopant, from among p or n, adapted to the type of charge carrier,
 an emission layer,
 a second transport layer of a second type of charge carrier, different from the first type of charge carrier, doped by a second type of dopant, different from the first type of dopant,
 a second electrode, of a second type of electrode, different from the first type of electrode, able to inject a second type of charge carrier, at least one of the transport layers comprising at least two elementary transport layers, characterised in that each elementary transport layer of the same transport layer has, in relation to an adjacent elementary transport layer, a mobility of charge carriers corresponding to said decreasing transport layer and consequently a decreasing conductivity the further the elementary transport layer is away in relation to the adjacent electrode, the elementary transport layers of the same transport layer having the same dopant concentration.

The technical effect of the present invention is to obtain a decrease in conductivity of one or more transport layers only by acting on the mobility of the charge carriers.

This is because the conductivity of the charge carriers is the product of the mobility of the charge carriers and the density of the charge carriers. The doping introduces an increase in the density of the charge carriers while their mobility remains unchanged.

According to the prior art, the decrease in conductivity was obtained by modifying the density of the charge carriers, which caused the previously mentioned drawbacks.

WO-A1 2007071450 for its part describes, in a plurality of stacked OLEDs, a selection of materials for which the conductivity is increasing starting from an electrode, which runs counter to the solution of the invention.

The present invention adopts the reverse procedure, which consists not of acting on the density of the charge carriers by reducing it the further away an elementary transport layer is from the associated electrode, but acting on the mobility of the charge carriers.

A variation in the mobility of the charge carriers of the elementary transport layer decreasing according to the distance of said layer with respect to the associated electrode is much easier to implement than modifying the concentration of dopant in a reduced concentration range as is the case with a variation in the number of charge carriers according to the prior art. This variation in the mobility of the charge carriers may for example be obtained by changing base material of an elementary transport layer with respect to the material of an adjacent layer, the material of the layer furthest away from the electrode having the lowest charge carrier mobility.

This is done without having to modify the concentration of dopant in the elementary transport layers, which is a constraining manufacturing operation. The present invention on the contrary proposes the use of various transport materials having different charge carrier mobilities doped with the same dopant concentration.

Transport layer means a layer able to fulfil a function of transporting a type of charge. When the layer comprises several elementary transport layers, these follow each other while being in contact, through the thickness of the OLED. The transport layer is thus a stack of elementary layers.

Advantageously, a p-type dopant used for doping an elementary transport layer is an organic or inorganic dopant and has a LUMO or conduction band level greater than 4 eV.

Advantageously, said LUMO or conduction band level is greater than 4.8 eV.

Advantageously, an n-type dopant used for doping an elementary transport layer is an organic or inorganic dopant having a HOMO or valency band level of less than 4 eV.

Advantageously, said HOMO or valency band level is less than 3 eV.

The PIN light emitting diode further comprises:
  a first layer for blocking a second type of charge carrier, disposed between said first transport layer and said emission layer,
  a second layer for blocking a first type of charge carrier, disposed between said emission layer and said second transport layer.

Advantageously, the mobility of an elementary transport layer closest to the adjacent electrode is at least equal to $10^{-3}$ cm$^2$/Vs.

Advantageously, the conductivity of an elementary transport layer closest to the adjacent electrode is at least equal to $10^{-5}$ S/cm.

Advantageously, the decrease in mobility between an elementary transport layer and an adjacent elementary transport layer furthest away from the adjacent electrode is of a factor of at least ten.

Advantageously, the total thickness of a transport layer is at least equal to 100 nm.

Advantageously, the total thickness of a transport layer is at least equal to 200 nm.

Advantageously, the thickness of an elementary transport layer furthest away from the adjacent electrode is less than or equal to 30 nm.

Advantageously, the thickness of an elementary transport layer furthest away from the adjacent electrode is maximum, in order to contribute mainly to implementing the total thickness of the transport layer.

Advantageously, the first transport layer and the second transport layer comprise the same number of elementary transport layers and where the decrease in conductivity between an elementary transport layer and an adjacent elementary transport layer both belonging to the first transport layer is substantially equal to the decrease in conductivity between symmetrical elementary transport layers belonging to the second transport layer.

Advantageously, the PIN light emitting diode has a hole transport layer comprising at least two elementary transport layers chosen from the following three layers:
  a TPD elementary transport layer,
  a TPB elementary transport layer,
  an MTDATA elementary transport layer.

Advantageously, the PIN light emitting diode has an electron transport layer comprising at least two elementary transport layers chosen from the following four layers:
  a TPBI elementary transport layer,
  a Bphen elementary transport layer,
  a BAlq elementary transport layer,
  an Alq3 elementary transport layer.

Figure 2:
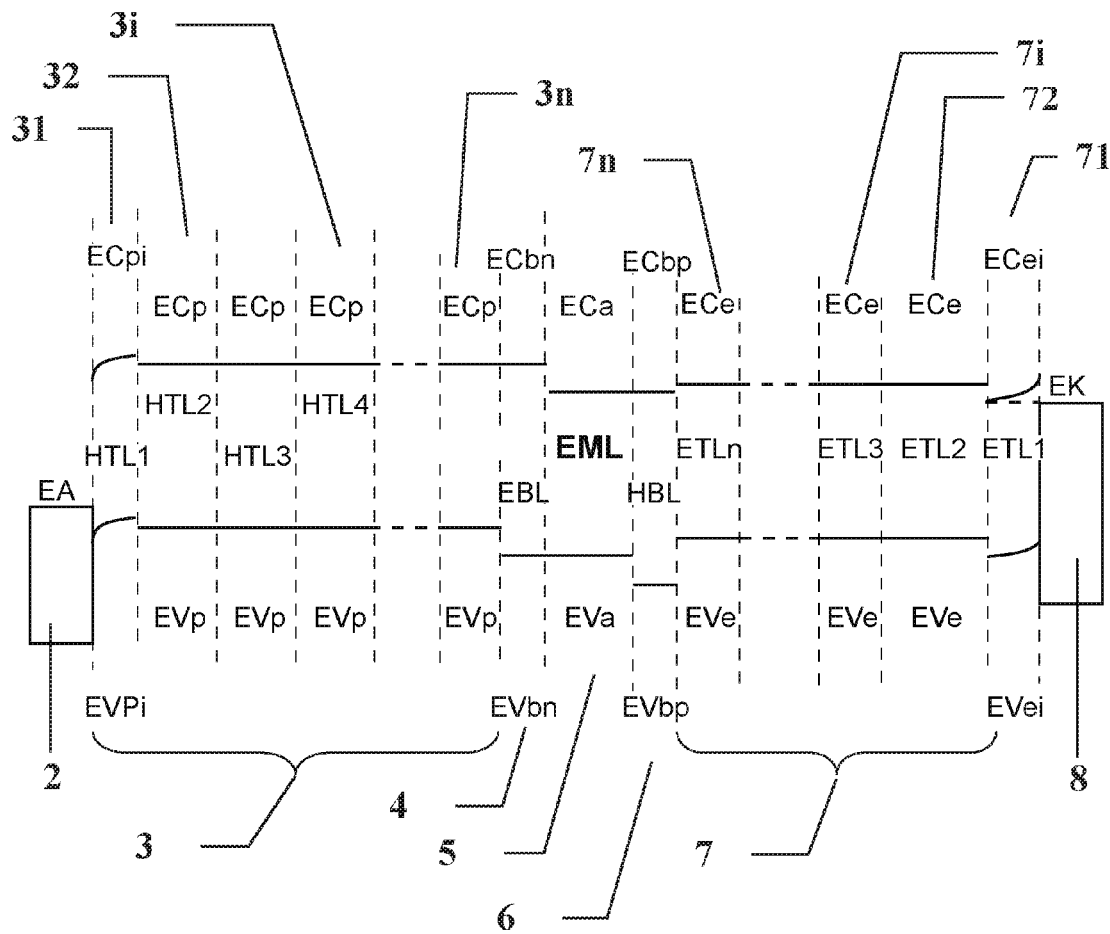
Figure 3A:
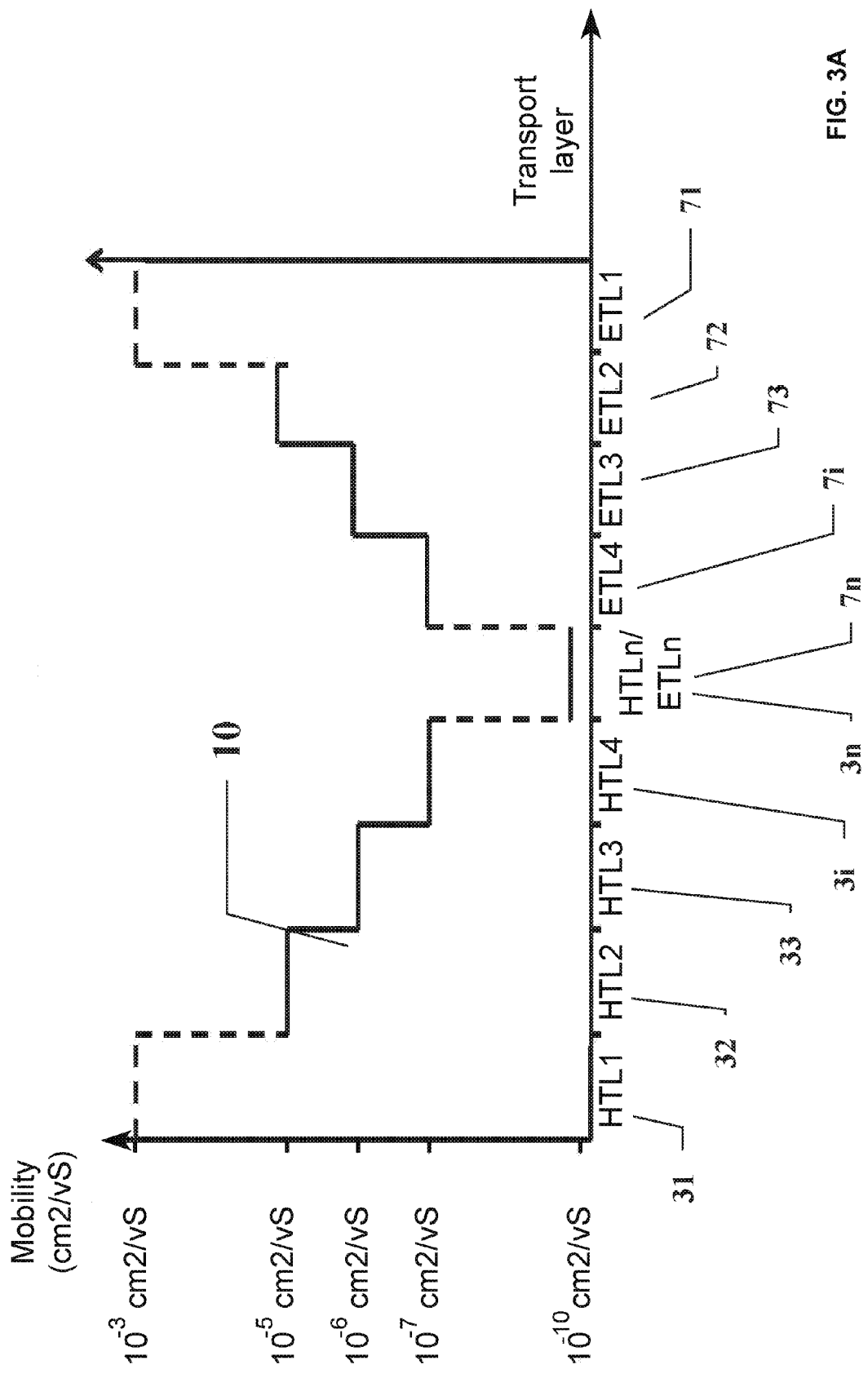
Figure 3B:
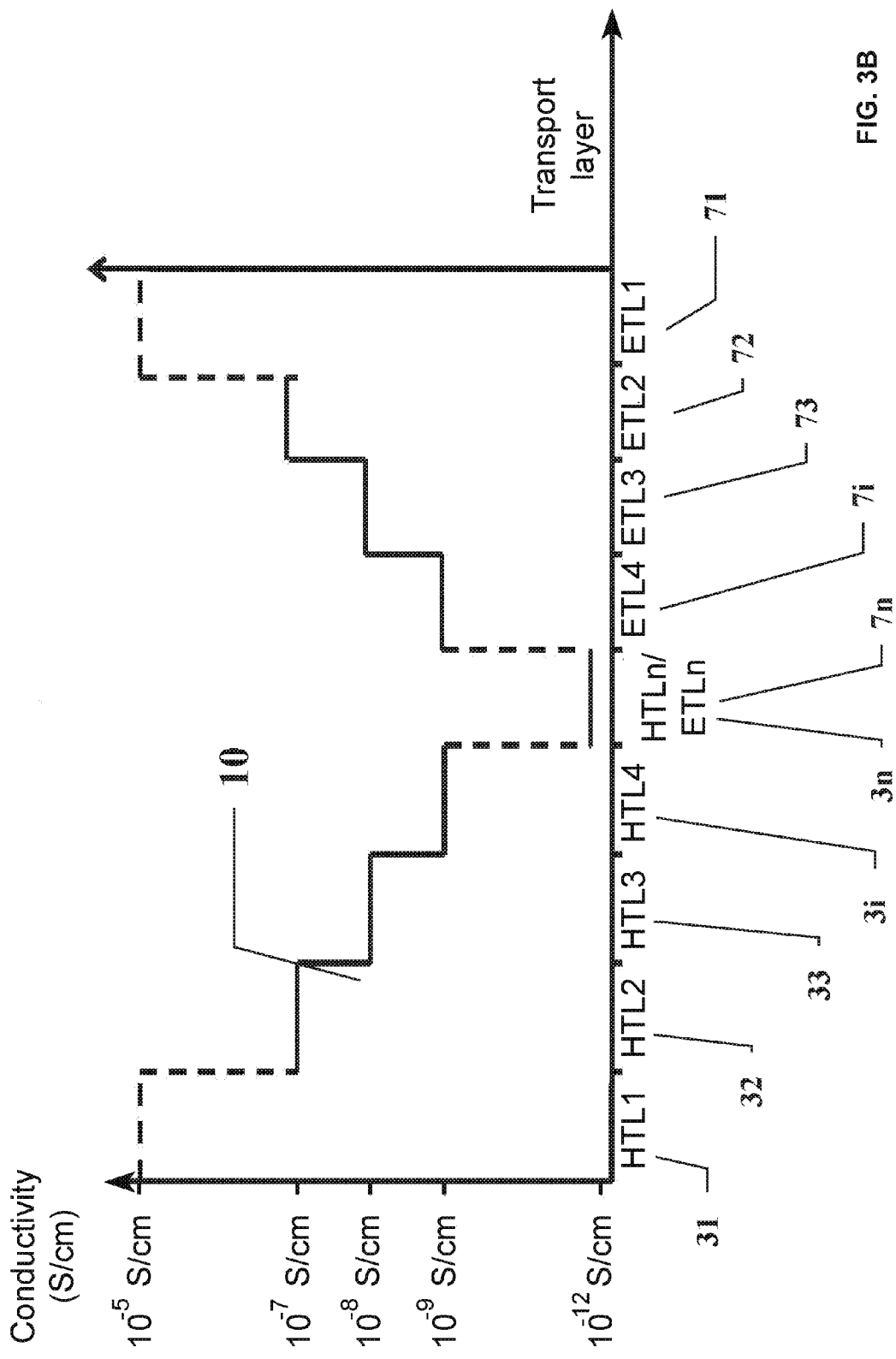
Figure 4:
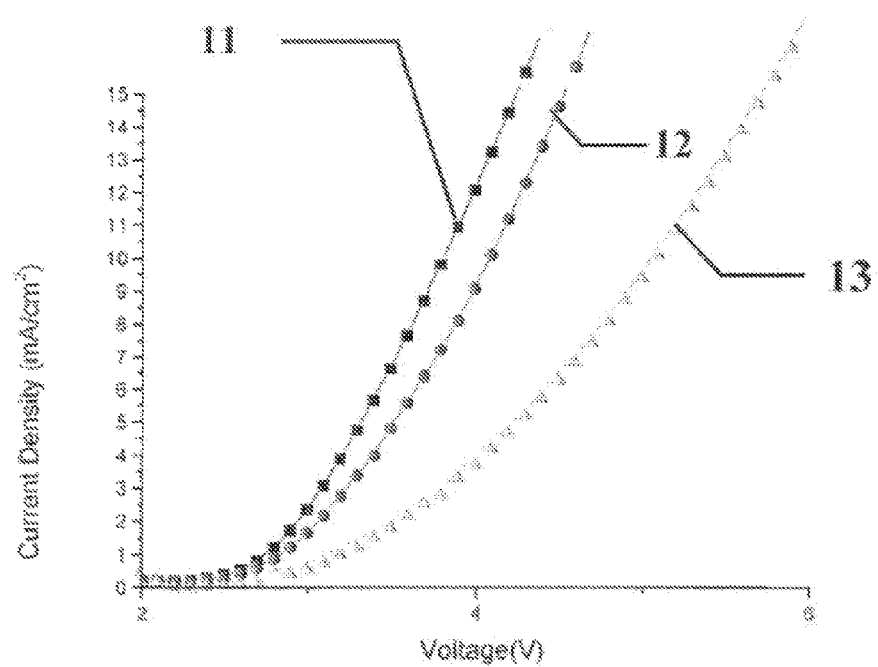

Other features, details and advantages of the invention will emerge more clearly from the detailed description given below by way of indication in relation to drawings, on which:

FIG. 1 presents a view in cross-section of an OLED according to the invention,

FIG. 2 presents a diagram of the relative energy levels of an OLED according to the invention, FIG. 3a presents a curve for the mobility through the elementary transport layers, FIG. 3b presents a curve for the conductivity through the elementary transport layers, FIG. 4 presents a comparative current/voltage diagram for embodiments of an OLED according to the invention with different numbers of elementary transport layers.

FIG. 1 presents an organic light emitting diode, OLED, of the PIN type. Such an OLED is characterised by a stack, comprising an emission layer 5 or active layer, disposed centrally between two electrodes 2, 8. This emission layer 5 is also referred to as EML. The application of an electrical voltage between the two electrodes, a cathode 8 and an anode 2, effects an injection of respective charge carriers into the OLED. The charge carriers are of two types: negative electrical charge electrons issuing from the cathode 8 and positive holes with a positive electrical charge issuing from the anode 2. These respective charge carriers migrate in opposite directions in the OLED, until they join, ideally in said emission layer 5. They pair up in twos, between different charge carriers, that is to say an electron with a hole, in order to form an exciton. Said exciton, when it forms in the active layer 5, because of the particular chemical composition of said active layer 5, effects a radiative recombination that produces a photon and thus gives a light emission 9. This light emission 9 diffuses through the anode 2 and substrate 1, both advantageously translucent, in the case of a downward-emission OLED.

Said stack is typically disposed on a substrate 1 and the components of said stack are globally protected from attacks from the environment, in particular oxidation by air, moisture, etc., by encapsulation, not shown in the figures.

An active layer 5, capable of emitting a red light, may in particular be implemented by means of a layer of Alq3 doped at a concentration of 1% with a red organic emitter, such as 4-(dicyanomethylene)-2-t-butyl-6(1,1,7,7-tetramethylju-lolidyl-9-enyl)-4H-pyran (DCJTB). Such an emission layer 5 has a typical thickness of 20 nm. This layer, as well as all the layers described in the present application, may typically be produced, in a known manner, by thermal evaporation under a vacuum of less than $10^{-5}$ mtorr.

As previously mentioned, the invention concerns more particularly an OLED of the PIN type. PIN type designates an OLED produced by framing an insulating layer, the I of PIN, here the light emission layer EML 5, by a doped transport layer 3 of the p type, the p of PIN, and by a doped transport layer 7 of the n type, the n of PIN.

A PIN-type OLED typically comprises, stacked in a successive and ordered manner:
- an anode EA 2,
- a hole transport layer HTL 3,
- an emission layer EML 5,
- an electron transport layer ETL 7,
- a cathode EK 8.

Thus this stack comprises, symmetrically, an electrode 2, 8, a first transport layer 3, 7 for charge carriers of a first type, an emission layer 5, a second transport layer 3, 7 for charge carriers of a second type and a second electrode 2, 8.

Each electrode 2, 8 is able to inject a different type of charge carrier. An anode 2 injects holes. A cathode 8 injects electrons. An anode 2 is typically produced from indium and tin oxide, otherwise referred to as ITO, to a thickness of 120 nm. A cathode 8 is typically produced from aluminium to a thickness of 100 nm.

A transport layer 3, 7 is adjacent to an electrode 2, 8 and is doped by a dopant that may be of p type or n type. A transport layer 3, 7 is doped in order to favour the transport of one type of charge carrier. This type of charge carrier is the type of charge carrier injected by the electrode 2, 8 that is adjacent thereto. A p-type doping comprises an electron-accepter dopant and thus favours the transport of holes. An n-type doping comprises an electron-donor dopant and thus favours the transport of electrons. The transport layer 3 adjacent to the anode 2, which injects holes, is a hole transport layer 3 and is p-type doped. The hole transport layer 3 is also referred to as HTL, from the English hole transport layer. The transport layer 7 adjacent to the cathode 8, which injects electrons, is an electron transport layer 7 and is n-type doped. The electron transport layer 7 is also referred to as ETL, from the English electron transport layer.

Referring to the figures of the present application, according to an important feature of the invention, one transport layer 3, 7 at least is produced by means of at least two layers. Each of the layers that thus constitute a transport layer 3, 7 is hereinafter referred to as an elementary transport layer 31, 32, 33, 3i, 3n, 71, 72, 73, 7i, 7n. Such an elementary transport layer 31-3n, 71-7n advantageously has, in relation to an adjacent elementary transport layer, a decreasing mobility the further away it is from the elementary transport layer 31-3n, 71-7n relative to the adjacent electrode 2, 8. Thus the elementary transport layer 31, 71 closest to the adjacent electrode 2, 8 of the "parent" transport layer 3, 7 has the highest mobility. Next the mobility decreases from elementary transport layer 31-3n, 71-7n to elementary transport layer 31-3n, 71-7n, the further away from the electrode 2, 8 and the closer to the emission layer 5.

At least one of the two transport layers 3, 7 is thus produced by means of elementary transport layers 31-3n, 71-7n. The other transport layer 3, 7 may be produced according to the prior art in a single thick layer. However, the embodiment with decreasing mobility with distancing from the electrode 2, 8 is advantageously applied to the two transport layers 3, 7.

The dopant used for an elementary transport layer 31-3n, 71-7n is not different from one elementary transport layer to another elementary transport layer. However, all the elementary transport layers 31-3n, 71-7n of the same type of transport layer 3, 7 advantageously favour the transport of the same type of charge carrier. Thus all the elementary transport layers of the same "parent" transport layer 3, 7 are advantageously doped with a dopant of the same type, from p or n, as the type of dopant that would have been used to produce a single transport layer. The dopant concentration is constant in all the transport layers.

By way of example, an elementary hole-transport layer 31-3n can be produced by means of 2,7-Bis[N,N-bis(4-methoxy-phenyl)amino]-9,9-spirobifluorene (MeO-Spiro-TPD); Phthalocyanine (CuPc); 4,4',4"-tris-(3-methylphenylphenylamino)triphenylamine (m-MTDATA); 2,2',7,7'-tetra(N,N-di-tolyl)amino-spiro-bifluorene (spiro-TTB); 4,4'-bis-[N-(naphthyl)-N-phenyl-amino]biphenyl (α-NPD); N,N'-bis (Inaphthyl)N,N'-diphenyl-1,1'-biphenyl-4,4'-diamine (NPB); N,N'-diphenyl-N,N'-bis(3-methyl-phenyl)-1,1'biphenyl-4, 4'diamine (TPD), in the case of an HTL hole transport layer, p doped.

By way of example, an elementary transport layer 71-7n for electrons may be produced by means of N-arylbenzimidazoles trimer (TPBI); 4,7-Diphenyl-1,10-phenanthroline (Bphen); bis(2-methyl-8-quinolinate)-4-phenylphenolate aluminium (BAlq); tris-(8-hydroxyquinoline) aluminium (Alq3).

According to an advantageous embodiment in order to simplify industrial production, each elementary transport layer 31-3n, 71-7n is doped with the same dopant concentration. This greatly simplifies the process for producing an elementary transport layer 31-3n, 71-7n.

A transport layer 3, 7 is thus obtained having an electrical conductivity variable according to the depth of this transport layer. The electrical conductivity curve then typically has a stepped form as illustrated in FIG. 3b, which shows a curve 10 showing on the Y-axis the electrical conductivity, expressed in Siemens/centimeter or S/cm, as a function of the elementary transport layer 31-3n, 71-7n, depicted on the X-axis.

For a given chemical dopant composition, the conductivity of the elementary transport layer 31-3n, 71-7n is an increasing function of mobility.

A p-type dopant favours the movement of holes and is used for doping an elementary transport layer 31-3n belonging to a hole transport layer HTL 3. This component may be organic, inorganic or metallic. Advantageously according to the invention, any p-type organic dopant used for doping such an elementary transport layer 31-3n has a LUMO level greater than 4 eV. This advantageously allows the transfer of electrons from the transport layer to the p dopant.

Ideally the LUMO level is greater than 4.8 eV.

In a similar fashion, an n-type dopant favours the movement of electrons and is used to dope an elementary transport layer 71-7n belonging to an electron transport layer ETL 7. This component may be organic, inorganic or metallic. Advantageously, according to the invention, any n-type organic dopant used for doping such an elementary transport layer 71-7n has a HOMO level of less than 4 eV. This advantageously allows the transfer of n-dopant electrons to the transport layer.

Ideally said HOMO level is less than 3 eV.

The LUMO and HOMO levels apply only to organic dopants. In the case of an inorganic dopant, it is necessary to replace the term LUMO by "conduction band" and to replace the term HOMO by "valency band".

In the case of a p-type metallic dopant, the metal output work is advantageously greater than 4 eV. Ideally the output work is greater than 4.7 eV. In the case of an n-type metallic dopant, the metal output work is advantageously less than 4 eV. Ideally the output work is less than 3 eV.

The literature provides numerous indications of HUMO and LUMO values. The values may moreover be measured by cyclic voltammetry and by measuring absorption of the materials.

According to an optional embodiment, it is possible to add to an OLED of the PIN type at least one blocking layer 4, 6. A blocking layer 4, 6 is a layer able to block/slow a type of charge carrier. The type of charge carrier is determined by the type of dopant used. A blocking layer 4, 6 for a type of charge carrier is advantageously disposed, adjacent to the emission layer 5, on the side opposite to the electrode 2, 8 that injects said type of charge carrier.

Thus a hole-blocking layer 6 is advantageously disposed adjacent to the emission layer EML 5, on the opposite side, in relation to the emission layer EML 5, to the anode 2 that injects said holes. A hole-blocking layer 6 is also referred to as HBL, from the English hole-blocking layer. A hole-blocking layer 6 is advantageously disposed between the electron transport layer ETL 7 and the emission layer EML 5.

Thus an electron-blocking layer 4 is advantageously disposed adjacent to the emission layer EML 5, on the opposite side, in relation to the emission layer EML 5, to the cathode 8 that injects said electrons. An electron-blocking layer 4 is also referred to as EBL, from the English electron-blocking layer. An electron-blocking layer 4 is thus advantageously disposed between the hole transport layer HTL 3 and the emission layer EML 5.

Thus disposed, on the side opposite to an electrode 2, 8 that injects a type of charge carrier, a blocking layer 4, 6 able to block this type of charge carrier prevents said charge carriers from leaving the emission layer EML 5. The blocking layer or layers 4, 6 thus produce an effect of confinement of the charge carriers, and therefore of the excitons, in the emission layer EML 5. This has the effect of improving the external light efficiency, by producing more photons for the same number of charge carriers injected.

The blocking layer or layers 4, 6 have energy levels adapted to the adjacent emission layer EML 5.

By way of example, an electron-blocking layer EBL 4 may be produced by means of N,N'-diphenyl-N,N'-bis(3-methylphenyl)-1,1'biphenyl-4,4'diamine (TPD), at an indicative thickness of 10 nm.

By way of example, a hole-blocking layer HBL 6 may be produced by means of benzimidazolyl-benzene (TPBi), in an indicative thickness of 10 nm.

Within a transport layer 3, 7, there are several elementary transport layers 31-3n, 71-7n. One of these elementary transport layers, the elementary transport layer 31, 71 closest to the adjacent electrode 2, 8, fulfils a particular role. This first elementary transport layer 31, 71 has a mobility at least equal to $10^{-3}$ cm$^2$/Vs. This mobility introduces, with a high doping, a conductivity at least equal to $10^{-5}$ S/cm and, at the interface for contact with the elementary transport layer 31, 71 and the electrode 2, 8, greatly reduces the energy barrier. This reduction advantageously makes it possible to perform an effective injection of the charge carriers. This advantageously makes it possible to preserve a threshold voltage of the same order as the interval of the emission layer 5. This is particularly visible on the energy diagram in FIG. 2.

The mobility of the following elementary transport layers 32-3n, 72-7n is determined as being less high, while being such that each following elementary transport layer 32-3n, 72-7n ensures satisfactory transport of the charge carriers.

Advantageously again, in order to produce an optimum result, the decrease in the mobility and consequently conductivity between an elementary transport layer 31-3n, 71-7n and an adjacent elementary transport layer further away from the adjacent electrode 2, 8 is by a factor of at least 10.

Thus the dopant concentration in all the transport layers is advantageously constant. In the case of an organic dopant, the dopant concentration is greater than 1%, ideally 6%. In the case of an inorganic dopant the dopant concentration is greater than 5%, ideally 15%. In the case of a metallic dopant the dopant concentration is greater than 10%, ideally 50%.

Thus the mobility and consequently the conductivity decreases by an order of magnitude from one elementary transport layer 31-3n, 71-7n to its more central neighbour. Referring to FIG. 3a, if the elementary transport layer 31, 71 closest to the electrode 2, 8 has an electrical mobility of $10^{-3}$ cm$^2$/Vs, the following elementary transport layer 32, 72 has an electrical mobility of $10^{-4}$ cm$^2$/Vs.

Referring to FIG. 3b, if the elementary transport layer 31, 71 closest to the electrode 2, 8 has an electrical conductivity of $10^{-6}$ S/cm, the following elementary transport layer 32, 72 has an electrical conductivity of $10^{-6}$ S/cm.

A transport layer 3, 7 also has the function of flattening the electrode 2, 8 adjacent to it. This is applicable at least to the anode 2.

This is because, when an OLED is produced, the base substrate 1 must be perfectly clean of any dust. Despite all efforts for working in a clean area, such an aim is difficult to achieve. In addition the electrode 2, 8, through its very implementation, inevitably has a steeply sloped topography having not insignificant peaks in comparison with the relative thickness envisaged for the various layers. In order to overcome these roughnesses, dust and peaks, it is necessary for the transport layer 3, 7 overall to have a thickness such that it totally immerses said roughnesses, thus producing flattening. In order to produce this flattening, it is necessary for the total thickness of the transport layer 3, 7 to be at least equal to 100 nm.

With the increase of the dimensions occasioned by an implementation of a matrix of OLEDs, the mean height of said roughnesses increases. A thickness of 150 nm for the transport layer 3, 7 makes it possible to effect a matrix with a larger dimension. With the increase of the matrix surface area, the mean height of said roughnesses continues to increase until it reaches a limit value where saturation occurs. It thus appears that a total thickness of the transport layer 3, 7 ideally equal to 200 nm makes it possible to effect a satisfactory flattening, including for matrices of large dimensions.

It is remarkable that the flattening is obtained by means of the total thickness of the transport layer 3, 7, that is to say the sum of the thicknesses of the constituent elementary transport layers 31-3n or 71-7n.

Thus the prior art required a flattening transport layer of great thickness, 100 to 200 nm, and having high conductivity, greater than $10^{-6}$ S/cm. This requires high mobility of the charge carriers. On the other hand, a decrease in electrical mobility according to the invention makes it possible to obtain separately, firstly the necessary high conductivity, in contact with the electrode 2, 8, and secondly a total thickness of the transport layer 3, 7 that is sufficiently great to effect the flattening by means of other elementary transport layers 32-3n, 72-7n. Because of their lower mobility, the gradual decrease in the electrical conductivity in the elementary transport layers 31-3n or 71-7n nevertheless guarantees electrical and light performances, such as the energy efficiency level, very close to those obtained with a single transport layer according to the prior art and good homogeneity on OLEDs having large surfaces.

In order to achieve its injection function while having high mobility and consequently high electrical conductivity, the first elementary transport layer 31, 71, adjacent to the electrode 2, 8, requires only a thickness of at least 10 nm. Ideally such a first elementary transport layer 31, 71 has a maximum thickness of 30 nm. The thicknesses of the other elementary transport layers 32-3n, 72-7n are any thicknesses. They depend on the number of elementary transport layers, the total thickness of the transport layer 3, 7 and the variation in electrical mobility required with the following elementary transport layer.

Advantageously again and in a complementary manner, producing the total thickness of the transport layer 3, 7, in order to fulfil the flattening function, can be achieved by means of a majority contribution of the last elementary transport layer 3n, 7n or elementary transport layer that is the furthest away from the electrode 2, 8 and also the one that is closest to the emission layer 5.

Thus a hole-transport layer 3, shown illustratively but non-limitatively, may comprise the following three elementary transport layers 31-33:
- a first TPD elementary transport layer 31 doped to the extent of 3% with F4-TCNQ dopant with a thickness of 30 nm,
- a second TPB elementary transport layer 32 doped to the extent of 3% with F4-TCNQ dopant with a thickness of 20 nm,
- a third MTDATA elementary transport layer 33 doped to the extent of 3% with F4-TCNQ dopant with a thickness of 110 nm.

Thus it appears that the last elementary transport layer 33 contributes to the major part of the thickness of 150 nm of the hole transport layer.

The intrinsic mobility of the TPD, TPB and MTDATA layer is around $10^{-3}$ cm$^2$/Vs, $10^{-4}$ Ns, $10^{-5}$ cm$^2$/Vs, respectively. This is because, by doping these materials with 3% F4TCNQ, the conductivity of the TPD, TPB and MTDATA layer is around respectively $10^{-5}$ cm$^2$/Vs, $10^{-6}$ cm$^2$/Vs, $10^{-7}$ cm$^2$/Vs.

The conductivity curve 10 in FIG. 3b, decreasing from an elementary transport layer 31, 71 adjacent to an electrode 2, 8 as far as an elementary transport layer furthest away from the electrode 2, 8 and adjacent to the emission layer 5 or to a blocking layer 4, 6, may have any form. It appears however that a regular decrease, that is to say log-linear or, which is equivalent, in a regular geometric progression such as that of the curve 10 illustrated, favours the transport of the charge carriers and proves optimum.

Likewise, the number of respective elementary transport layers of the hole-transport layer HTL 3 and of the electron-transport layer ETL 7 are different. With the same number of elementary transport layers, it may also be possible to have different conductivity variation symmetries on either side of the emission layer.

However, it appears that symmetry of the electrical conductivity curve 10 is profitable in that it improves the performances of the OLED. Thus it is advantageous to produce the first transport layer 3, 7 and the second transport layer 3, 7 by subdividing each of them by the same number of elementary transport layers.

In addition it is advantageous for a decrease in conductivity between one elementary transport layer and an adjacent elementary transport layer both belonging to the first transport layer to be substantially equal to the decrease in conductivity between the symmetrical elementary transport layers belonging to the second transport layer.

With reference to FIG. 4, the influence of the number of elementary transport layers 31-3n or 71-7n is shown. FIG. 4 presents a current density diagram in mA/cm$^2$ according to the voltage applied for three embodiments of an OLED. The curve 11 presents the characteristic curve of a PIN-type OLED the transport layers 3, 7 of which comprise a single elementary transport layer. The curve 12 presents the characteristic curve of a PIN-type OLED the transport layers 3, 7 of which comprise two elementary transport layers. The curve 13 presents the characteristic curve of a PIN-type OLED the transport layers 3, 7 of which comprise three elementary transport layers. In each embodiment, the elementary transport layer 31, 71 adjacent to the electrode 2, 8 has a conductivity of $10^{-5}$ S/cm. Any following elementary transport layers 32-3n, 72-7n have respectively and, in order of closeness to the emission layer 5, conductivities of $10^{-6}$ and $10^{-7}$ S/cm.

A comparison of curves 11 to 13 shows that all the OLEDs have the same threshold voltage around 2.5 V. This is directly related to the doping of the first elementary transport layers 31, 71 since the threshold voltage is mainly controlled by the injection barriers situated at the interface between this first elementary transport layer 31, 71 and the electrode 2, 8.

The low resistance of a PIN-type stack, under positive biasing, added to a limited conductivity of the electrode 2, 8, typically produced from indium and tin oxide, referred to as ITO, for an anode 2 cause a high voltage drop through the electrode 2, 8. This leads to high light disparities from one OLED to another in a matrix arrangement of large size. According to the prior art it is possible to obtain only a uniformity, defined as the ratio of the minimum luminance to the maximum luminance over the entire surface, not exceeding 70% for a very limited surface area of 1 cm$^2$. For larger surfaces, the uniformity drops rapidly around 40%.

The comparison of the curves 11 to 13 also and especially shows that the slope of the curves 11 to 13 decreases substantially with the number of elementary transport layers. This reduction promotes the uniformity of the luminance over an extended surface area greater than 50 cm$^2$. The uniformity is only 40% for a device with an elementary transport layer of the curve 11 illustrating the prior art. The device with two layers of the curve 12 makes it possible to observe a uniformity of 55%. The device with three layers of the curve 13 makes it possible to observe a uniformity of 80%.

Although one or more preferred embodiments of the invention are described herein, it must be clearly understood that the invention is not limited to these embodiments and that variations can be made within the scope of the following claims.

The invention claimed is:

1. A PIN type organic light emitting diode (OLED) comprising:
   a first electrode, of a first electrode type, configured to inject a first type of charge carrier from among one of an electron and a hole;
   a first transport layer, of the first type of charge carrier, doped by a first type of dopant adapted to the first type of charge carrier;
   an emission layer;
   a second transport layer, of a second type of charge carrier different from the first type of charge carrier, doped by a second type of dopant different from the first type of dopant; and
   a second electrode, of a second electrode type different from the first electrode type, configured to inject the second type of charge carrier, wherein at least one of the first transport layer and the second transport layer comprises at least two elementary transport layers, and wherein each elementary transport layer of a same transport layer has a mobility of charge carriers that is less than a mobility of charge carriers of an adjacent elementary transport layer, said adjacent elementary transport layer contacts said elementary transport layer and is located farther from the emission layer than said elementary transport layer, and wherein the elementary transport layers of a same first or second transport layer have a same dopant concentration.

2. The PIN type OLED according to claim 1, wherein a p-type dopant used for doping the elementary transport layer is an organic or inorganic dopant and has a lowest unoccupied molecular orbital (LUMO) or conduction band level greater than 4 eV.

3. The PIN type OLED according to claim 2, wherein said LUMO or conduction band level is greater than 4.8 eV.

4. The PIN type OLED according to claim 1, wherein an n-dopant used for doping the elementary transport layer is an organic or inorganic dopant and has a highest occupied molecular orbital (HOMO) or valence band level of less than 4 eV.

5. The PIN type OLED according to claim 4, wherein said HOMO or valence band level is less than 3 eV.

6. The PIN type OLED according to claim 1, further comprising:
    a first layer for blocking a second type of charge carrier, disposed between said first transport layer and said emission layer; and
    a second layer for blocking a first type of charge carrier, disposed between said emission layer and said second transport layer.

7. The PIN type OLED according to claim 1, wherein the mobility of charge carriers in the elementary transport layer closest to the adjacent first or second electrode is at least equal to $10^{-3}$ cm$^{-2}$/Vs.

8. The PIN type OLED according to claim 1, wherein a conductivity of the elementary transport layer closest to the adjacent first or second electrode is at least equal to $10^{-5}$ S/cm.

9. The PIN type OLED according to claim 1, wherein a decrease in mobility between the elementary transport layer and the adjacent elementary transport layer farthest away from the adjacent first or second electrode is of a factor of at least ten.

10. The PIN type OLED according to claim 1, wherein a total thickness of a first or second transport layer is at least equal to 100 nm.

11. The PIN type OLED according to claim 10, wherein a total thickness of a first or second transport layer is at least equal to 200 nm.

12. The PIN type OLED according to claim 1, wherein a thickness of the elementary transport layer closest to the adjacent first or second electrode is less than or equal to 30 nm.

13. The PIN type OLED according to claim 1, wherein the elementary transport layer farthest from the adjacent first or second electrode is thicker than other elementary transport layers of the transport layer.

14. The PIN type OLED according to claim 1, wherein the first transport layer and the second transport layer have the same number of elementary transport layers, and wherein a decrease in conductivity between the elementary transport layer and the adjacent elementary transport layer both belonging to the first transport layer is substantially equal to a decrease in conductivity between symmetrical elementary transport layers belonging to the second transport layer.

15. The PIN type OLED according to claim 1, wherein the first or second transport layer is a hole-transport layer comprising the at least two elementary transport layers chosen from one of:
    a TPD elementary transport layer,
    a TPB elementary transport layer, and
    an MTDATA elementary transport layer.

16. The PIN type OLED according to claim 1, wherein the first or second transport layer is an electron-transport layer comprising the at least two elementary transport layers is chosen from one of:
    a TPBI elementary transport layer,
    a Bphen elementary transport layer,
    a BALq elementary transport layer, and
    an Alq3 elementary transport later.

17. The PIN type OLED according to claim 1, wherein conductivity decreases based on a distance of the elementary transport layer away from one of the first electrode and the second electrode.

* * * * *